(12) United States Patent
Enomoto et al.

(10) Patent No.: US 7,038,328 B2
(45) Date of Patent: May 2, 2006

(54) ANTI-REFLECTIVE COMPOSITIONS COMPRISING TRIAZINE COMPOUNDS

(75) Inventors: Tomoyuki Enomoto, Fuchu-Machi (JP); Keisuke Nakayama, Fuchu-Machi (JP); Rama Puligadda, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 33 days.

(21) Appl. No.: 10/271,646

(22) Filed: Oct. 15, 2002

(65) Prior Publication Data
US 2004/0072420 A1 Apr. 15, 2004

(51) Int. Cl.
*H01L 23/29* (2006.01)
*B32B 27/32* (2006.01)

(52) U.S. Cl. .................. 257/791; 428/523; 524/236; 438/644

(58) Field of Classification Search ............ 257/632, 257/791, E51.051; 428/423.1, 500, 502, 522, 428/523; 523/135; 524/236; 525/87, 97, 180, 525/443
See application file for complete search history.

(56) References Cited

U.S. PATENT DOCUMENTS

| 4,780,228 | A | 10/1988 | Gardiner et al. |
| 5,094,765 | A | 3/1992 | DeRosa et al. |
| 5,693,691 | A | 12/1997 | Flaim et al. |
| 5,731,385 | A | 3/1998 | Knors et al. |
| 5,756,255 | A | 5/1998 | Sato et al. |
| 5,919,599 | A | 7/1999 | Meador et al. |
| 5,939,510 | A | 8/1999 | Sato et al. |
| 5,948,847 | A | 9/1999 | Iguchi et al. |
| 6,071,673 | A | 6/2000 | Iguchi et al. |
| 6,156,479 | A | 12/2000 | Meador et al. |
| 6,284,428 | B1 * | 9/2001 | Hirosaki et al. .......... 430/270.1 |
| 6,316,160 | B1 | 11/2001 | Shao et al. |
| 6,323,310 | B1 | 11/2001 | Puligadda et al. |
| 6,544,717 | B1 * | 4/2003 | Hirosaki et al. .......... 430/271.1 |
| 6,734,258 | B1 * | 5/2004 | Iguchi et al. ............. 525/329.7 |
| 2004/0086658 | A1 * | 5/2004 | Onoyama et al. ............ 427/458 |

FOREIGN PATENT DOCUMENTS

| EP | 0823881 | 2/1998 |
| JP | 10-080908 | 1/1998 |
| JP | 10-120940 | 5/1998 |
| WO | WO-9707145 | 2/1997 |
| WO | WO-9917161 | 4/1999 |
| WO | WO-9921058 | 4/1999 |
| WO | WO-9956178 | 11/1999 |

OTHER PUBLICATIONS

Proc. SPIE, "Methacrylate Resists and Antireflective Coatings for 193 nm Lithography," vol. 3678, pp. 174–185 (1999).
Proc. SPIE, "Recent Progress in 193 nm Antireflective Coatings," vol. 3678, pp. 800–809 (1999).
Proc. SPIE, "Properties and Performance of Near UV Reflectivity Control Layers," vol. 2195, pp. 225–229 (1994).

* cited by examiner

*Primary Examiner*—Lisa Kilday
(74) *Attorney, Agent, or Firm*—Hovey Williams LLP

(57) ABSTRACT

The present invention relates to an anti-reflective coating composition characterized by comprising a resin made from triazine compounds having at least two nitrogen atoms substituted a hydroxymethyl group and/or an alkoxymethyl group, and a light absorbing compound and/or a light absorbing resin. The present invention offers an anti-reflective coating composition for the anti-reflective coating having high light absorption property of the light used for the lithography process in the preparation of semiconductor device, showing high reflective light preventing effect, being used at thinner film thickness more than before, and having greater dry etching rate in comparison to photoresist layer.

18 Claims, No Drawings

US 7,038,328 B2

ANTI-REFLECTIVE COMPOSITIONS COMPRISING TRIAZINE COMPOUNDS

BACKGROUND OF THE INVENTION

1. Field of the Invention

The present invention relates to a composition for an anti-reflective coating composition, which is effective in reducing the adverse effect of the reflection from the background substrate, and to a method for forming a photoresist pattern using this composition for an anti-reflective coating.

2. Description of the Prior Art

The fine processing with lithography using the photoresist composition has been conducted for the preparation of semiconductor device heretofore. Said fine processing is the processing method comprising forming a film of the photoresist composition over silicon wafer, irradiating active light rays such as UV light through the mask pattern over which the pattern of semiconductor device has been drawn, developing and executing the etching treatment of silicon wafer of thus obtained photoresist pattern as the protective film. However, the higher degree of integration of semiconductor device has been achieved in recent years and active light rays used show tendency toward preferring short wave length from KrF excimer laser (248 nm) to ArF excimer laser (193 nm). Along with this progress, effects of irregular reflection and standing wave of active light rays from the substrate have become the major concern. Therefore, the method of providing the Bottom anti-reflective coating between the photoresist and the substrate has been extensively investigated.

Inorganic bottom anti-reflective coating made of such as titanium, titanium dioxide, titanium nitride, chrome oxide, carbon, α-silicon and the like, and organic bottom anti-reflective coating made of light absorbing material and polymer compound as the bottom anti-reflective coating are known. The former requires facilities such as vacuum deposition equipment, CVD device, spattering device and the like, while the latter is advantageous since the latter does not require any special facilities and therefore various investigations have been conducted. Example of as such are acrylic resin type bottom anti-reflective coating with hydroxyl group as crosslinking forming functional group and light absorbing group in the same molecule disclosed in U.S. Pat. No. 5,919,599 and novolac resin type bottom anti-reflective coating with hydroxyl group as crosslinking forming functional group and light absorbing group in the same molecule described in U.S. Pat. No. 5,693,691 among others.

The desirable physical properties for the organic type bottom anti-reflective coating materials are having high absorbance against light or irradiation rays, absence of intermixing with photoresist layer (insoluble in resist solvent), no diffusion of small molecule into overcoating resist from the bottom anti-reflective coating material when applied or dried with heating, having large dry etching rate in comparison with resist and the like, and these are also described in for example Proc. SPIE, Vol. 3678, 174–185 (1999), Proc. SPIE, Vol. 3678, 800–809 (1999), Proc. SPIE, Vol. 2195, 225–229 (1994).

Along with the progress of resist pattern scale miniaturization, the thinner photoresist film is to be used. Therefore, it is needed to cut largely the time of organic bottom anti-reflective coating etching removal process, and an organic bottom anti-reflective coating which is usable at thinner thickness than ever before or which has bigger etching selectivity in comparison to photoresist than ever before has become required.

U.S. Pat. No. 5,756,255, No. 5,948,847, No. 6,284,428 and No. 2002/0055064 disclose anti-reflective coating compositions comprising triazine compounds.

SUMMARY OF THE INVENTION

An object of this invention is to provide an anti-reflective coating composition for the lithography process in the preparation of semiconductor device.

Another object of the invention is to provide an anti-reflective coating which absorbs the reflective light of the exposure light of 248 nm, 193 nm or 157 nm used for fine processing from the substrate, is free of intermixing with the photoresist layer, is capable of forming an excellent photoresist pattern, and has a large dry etching rate as compared with the photoresist.

Still another subject of the present invention is to provide the method of formation of photoresist pattern by the use of the anti-reflective coating composition.

The first subject of this invention relates to an anti-reflective coating composition comprising:

(A) a resin made from a triazine compound having at least two nitrogen atoms substituted by a hydroxymethyl group and/or an alkoxymethyl group, said resin having a weight average molecular weight of at least 5000; and (B) a light absorbing compound and/or a light absorbing resin.

The second subject relates to an anti-reflective coating composition according to the first subject, wherein said triazine compound is selected from the group consisting of melamine compounds and benzoguanamine compounds.

The third subject relates to anti-reflective coating composition according to the first subject, wherein said resin is made from melamine compounds having at least two nitrogen atoms substituted a hydroxymethyl group and/or an alkoxymethyl group and benzoguanamine compounds having at least two nitrogen atoms substituted a hydroxymethyl group and/or an alkoxymethyl group, and has a weight average molecular weight of 5000–50000.

The forth subject relates to an anti-reflective coating composition according to the first subject, wherein said resin is made from hexamethoxymethylmelamine and tetramethoxymethyl benzoguanamine, and has a weight average molecular weight of 7000–30000.

The fifth subject relates to an anti-reflective coating composition according to any one of the first to forth subjects, wherein said light absorbing compound is at least one compound selected from the group consisting of naphthalene compounds and anthracene compounds.

The sixth subject relates to an anti-reflective coating composition according to any one of the first to forth subjects, wherein said a light absorbing compound is 9-hydroxymethylanthracene.

The seventh subject relates to an anti-reflective coating composition according to any one of the first to sixth subjects, said light absorbing resin has at least one ring structure selected from the group consisting of benzene ring structure, naphthalene ring structure and anthracene ring structure.

The eighth subject relates to an anti-reflective coating composition according to any one of the first to seventh subjects, which further contains an acid and/or acid generator.

The ninth subject relates to an anti-reflective coating composition according to any one of the first to eighth subjects, said acid is at least one acid selected from the group consisting of aliphatic carboxylic acids, aliphatic sulphonic acids, aromatic carboxylic acids, and aromatic sulphonic acids.

The tenth subject relates to an anti-reflective coating composition according to any one of the first to ninth subjects, which further contains a resin which has a unit structure bearing at least one crosslinkable substituent in the unit.

The eleventh subject relates to an anti-reflective coating composition according to any one of the first to tenth subjects, wherein the amount on the component (A) is in the range from 50 to 99% by weight based on the total amount of the components (A) and (B).

The twelfth subject relates to a method for forming an anti-reflective coating for use in lithography process for manufacturing a semiconductor device, wherein said coating is obtained by applying an anti-reflective coating composition according to any one of the first to eleventh subjects onto a substrate and baking.

The thirteenth subject relates to a method for manufacturing a semiconductor device, comprising applying an anti-reflective coating composition according to any one of the first to eleventh subjects onto a substrate and baking it to form an anti-reflective coating, covering said coating with a photoresist, exposing the substrate covered with said anti-reflective coating and said photoresist, developing and transferring an image onto the substrate by etching to form integrated circuit elements.

DETAILED DESCRIPTION OF THE PREFERRED EMBODIMENTS

The present invention relates to an anti-reflective coating composition characterized by comprising a resin made from triazine compounds and a light absorbing compound. The invention also relates to an anti-reflective coating composition used in lithography process for manufacturing semiconductor device using short wavelength exposure lights such as KrF excimer laser (wave length 248 nm), ArF excimer laser (193 nm) and F2 excimer laser (157 nm).

An anti-reflective coating composition of this invention basically comprises (A) a resin which is made from a triazine compound having at least two nitrogen atoms substituted a hydroxymethyl group and/or an alkoxymethyl group, and has a weight average molecular weight of at least 5000, (B) a light absorbing compound and/or a light absorbing resin, and a solvent. The composition also contains optional components such as an acid, an acid generator, a surfactant, and the like. The dry solid content in the anti-reflective coating composition of the present invention is 0.1–50% by weight, preferably 0.5–30% by weight.

(A) component in the anti-reflective composition of the present invention is a resin made from a triazine compound having at least two nitrogen atoms substituted a hydroxymethyl group and/or an alkoxymethyl group.

Although it varies depending on coating solvent, solution viscosity, film configuration and the like being used, molecular weight of the resin of (A) component is preferably high in order to prevent pollution of the equipment used in the process resulting from sublimation of low-molecular-weight components during the baking process to form an anti-reflective coating and photoresist pollution resulting from diffusion of low-molecular-weight components into the photoresist layer during the post exposure bake process conducted after the photoresist exposure. However, too high molecular weight is not preferable for (A) component because the use of resin with too high molecular weight as (A) component can have a negative effect on coating property of the anti-reflective composition onto a substrate, in particular, onto a substrate having steps, holes and the like. Therefore, molecular weight of the resin of (A) component is at least 5000, preferably 5000–100000, 5000–50000, more preferably 7000–30000 as the weight average molecular weight.

Examples of triazine compound used to make a resin of (A) component are melamine and benzoguanamine compounds having a nitrogen atom hydrogen atom of which is substituted by a hydroxymethyl group or an alkoxymethyl group or both.

These melamine and benzoguanamine compounds are obtainable by, for example, allowing melamine and benzoguanamine to react with formalin in boiling water for hydroxymethylation. In this reaction, base catalyst such as sodium hydroxide, potassium hydroxide, tetramethylammonium hydroxide, and the like can be used. Alkoxymethylated melamine and benzoguanamine compounds are obtainable by allowing the hydroxymethylated melamine and benzoguanamine compounds to react with alcohol such as methanol, ethanol, isopropylalcohol, normal hexanol and the like. In this reaction, acid catalyst such as hydrochloric acid, sulfuric acid, methane sulphonic acid and the like can be used.

Examples of those melamine and benzoguanamine compounds are methoxymethylated melamine compounds commercially available as Cymel300, Cymel303, Cymel325, Cymel725, methylated methoxymethylated melamine compounds commercially available as Cymel370, Cymel701, methoxymethylated butoxymethylated melamine compounds commercially available as Cymel266, Cymel285, Cymel212, methylated methoxymethylated melamine compounds commercially available as Cymel272, Cymel202, methoxymethylated isobutoxymethylated melamine compound commercially available as Cymel238, butoxymethylated melamine compounds commercially available as Mycoat506, methoxymethylated ethoxymethylated benzoguanamine compound commercially available as Cymel1123, methoxymethylated butoxymethylated benzoguanamine compounds commercially available as Cymel1123–10, Mycoat130, methoxymethylated benzoguanamine compound commercially available as Mycoat105, Mycoat106, butoxymethylated benzoguanamine compound commercially available as Cymel1128, and methylated methoxymethylated benzoguanamine compound commercially available as Mycoat102; these are all products of Mitui Cyanamid Co., Ltd.

A resin of the (A) component can be obtained by condensation reaction of one kind of above mentioned triazine compounds or two or more kind of the triazine compounds. The resin can be obtained by the method described in U.S. Pat. No. 6,323,310. For example, hexamethoxymethylmelamine compound and tetramethoxybenzoguanamine compound in a organic solvent is condensed by heat to give a resin. Organic solvents used for this condensation reaction, for example, are ethyl lactate, ethylene glycol methyl ether, ethylene glycol ethyl ether, methyl cellulose acetate, ethyl cellulose acetate, diethylene glycol methyl ether, diethylene glycol ethyl ether, propylene glycol, propylene glycol methyl ether, propylene glycol methyl ether acetate, propylene glycol propyl ether acetate, toluene, xylene, methyl ethyl ketone, cyclopentanone, cyclohexanone, 2-hydroxy-2-methylpropionic acid ethyl ester, ethoxyacetic acid ethyl ester, hydroxyacetic acid ethyl ester, 2-hydroxy-3-methylbutanoic acid methyl ester, 3-methoxypropionic acid methyl ester, 3-methoxypropionic acid ethyl ester, 3-ethoxypropionic acid ethyl ester, 3-ethoxypropionic acid ethyl ester, pyruvic acid methyl ester, pyruvic acid methyl ester, ethyl acetate, butyl acetate, and butyl lactate. Acid compounds such as p-toluene sulfonic acid, salicylic acid, sulfosalicylic acid, citric acid, benzoic acid, hydroxybenzoic acid, methanesulfonic acid, trifluoroacetic acid, and trifluoromethanesulfonic acid can be used in the condensation reaction as a catalyst. In the case of using a catalyst, the amount of the catalyst is 0.001–50% by weight based on the total weight of the triazine compound and catalyst used. Reaction time of the condensation reaction is 0.5–100 hours and reaction temperature of the reaction is 25–200, although they vary depending on kind of triazine compound used, the weight average molecular weight of the desired resin and the like.

A resin of component (A) of this invention obtained by the reaction mentioned above has a structure in which each triazine moieties are joined via a —CH2- linkage group and a —CH2-O—CH2- linkage group. For example, a resin obtained from the reaction of hexamethoxymethylmelamine and tetramethoxybenzoguanamine has the structure (Formula I), and a resin obtained from tetramethoxybenzoguanamine has the structure (Formula II) shown below (where X represents —CH2- or —CH2-O—CH2-).

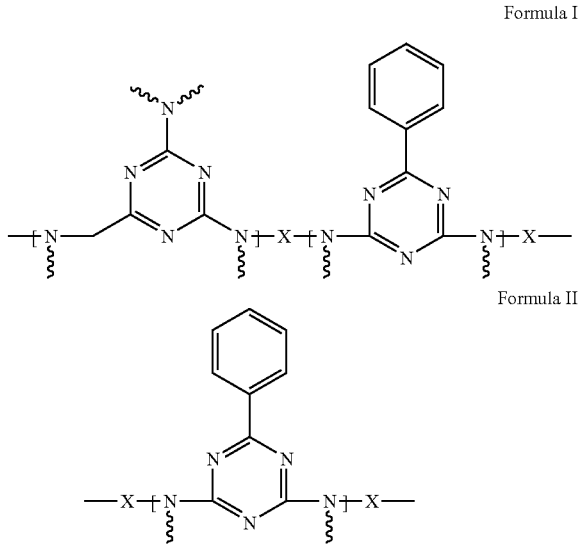

Formula I

Formula II

These resins can be used alone or in the combination of 2 or more kinds for the (A) component of the anti-reflective coating composition in this invention. The content of the (A) component in the anti-reflective coating composition of the invention is 50–99% by weight, preferably 70–95% by weight based on the total weight of component (A) and (B).

An anti-reflective coating composition of this invention contains a light absorbing compound and/or a light absorbing resin (component (B)). Compounds and resins which show high absorption ability with respect to light of wavelengths in the photosensitive characteristic region of the photosensitive component contained in the photoresist layer provided on the anti-reflective coating obtainable in the present invention and is capable of preventing standing waves resulting from the reflection of light at substrate from giving adverse effects or irregular reflection due to variations in height of the substrate surface are used as a light absorbing compound and a light absorbing resin of component (B).

A refractive index and an optical absorption factor of the anti-reflective coating formed from an anti-reflective coating composition of this invention can be controlled by selecting a kind and an amount of light absorbing compounds and light absorbing resins used in component (B).

Examples of the light absorbing compound are benzophenone compounds, benzotriazole compounds, azo compounds, naphthalene compounds, anthracene compounds, anthraquinone, and the like. Naphthalene compounds and anthracene compounds are preferable, and naphthalene compounds having at least one hydroxyl group, amino group or carboxyl group and anthracene compound bearing at least one hydroxyl group, amino group or carboxyl group are more preferable. These light absorbing compounds can be used alone or in the combination of two or more kinds.

Examples of the naphthalene compounds having at least one hydroxyl group, amino group or carboxyl group are 1-naphthalenecarboxylic acid, 2-naphthalenecarboxylic acid, 1-naphthol, 2-naphthol, 1-aminonaphthalene, 1-hydroxy-2-naphthoic acid, 1-hydroxy-2-naphthoic acid, 3-hydroxy-2-naphthoic acid, 6-hydroxy-1-naphthoic acid, 3,7-dihydroxy-2-naphthoic acid, 6-bromo-2-naphthol, 1,2-naphthalenedicarboxylic acid, 1,3-naphthalenedicarboxylic acid, 1,4-naphthalenedicarboxylic acid, 1,5-naphthalenedicarboxylic acid, 1,6-naphthalenedicarboxylic acid, 1,7-naphthalenedicarboxylic acid, 1,8-naphthalenedicarboxylic acid, 2,3-naphthalenedicarboxylic acid, 2,6-naphthalenedicarboxylic acid, 1,2-dihydroxynaphthalene, 1,5-dihydroxynaphthalene, 2,3-dihydroxynaphthalene, 2,6-dihydroxynaphthalene, 1,2-diaminonaphthalene, 1,6-diaminonaphthalene, 2,3-diaminonaphthalene, 2,6-diaminonaphthalene, 1-bromo-2-hydroxy-3-naphthoic acid, 1,6-dibromo-2-hydroxy-3-naphthoic acid, 3-hydroxy-7-methoxy-2-naphthoic acid, 1-amino-2-naphthol, 1,4,5,7-naphthalenetetracarboxylic acid, 3,5-dihydroxy-2-naphthoic acid, 2-ethoxy-1-naphthoic acid, 2,6-dichloro-1-naphthol, ethyl 3-hydroxy-2-naphthoate, methyl 3-hydroxy-7-methoxy-2-naphthoate, methyl 3,7-dihydroxy-2-naphthoate, 2,4-dibromo-1-naphthol, 6-acethoxy-2-naphthoic acid, 2,6-dibromo-1,5-dihydroxynaphthalene, 1-acetyl-2-naphthol, and the like.

Examples of the anthracene compounds bearing at least one hydroxyl group, amino group or carboxyl group are 9-anthracenecarboxylic acid, 9-hydroxymethylanthracene, 1-aminoanthracene, 1,8,9-trihydroxyanthracene, and the like.

Examples of the light absorbing resin are polyester resin, polyamide resin, polystyrene, novolac resin, polyacetal resin, (meth)acrylic resin, and the like which have a light absorbing ring structure such as anthracene ring, naphthalene ring, benzene ring, quinoline ring, quinoxaline ring, thiazole ring, and the like in their structure. Novolac resin and (meth)acrylic resin bearing anthracene ring, naphthalene ring or benzene ring are preferable. For example, resins having a unit structure shown below are preferable.

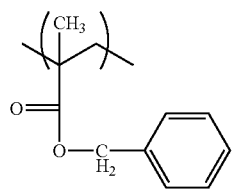

[1]

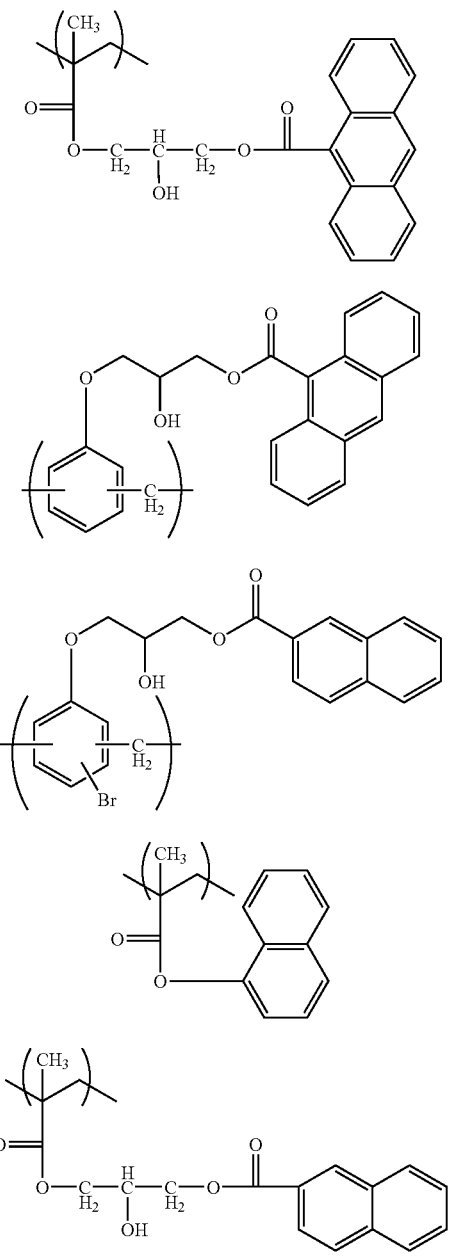

These light absorbing resins can be used alone or in the combination of two or more kinds, and a light absorbing compound and a light absorbing resin can be used in combination.

The content of the (B) component in the anti-reflective coating composition of this invention is 1–50% by weight, preferably 5–30% by weight based on the total weight of component (A) and (B).

An anti-reflective coating composition of this invention can further contain an acid and/or acid generator. Examples of these acids and acid generators are acid compounds such as acetic acid, methanesulfonic acid, trifluoroacetic acid, trifluoromethanesulfonic acid, benzoic acid, toluenesulfonic acid, pyridinium p-toluenesulfonate, salicylic acid, sulfosalicylic acid, citric acid, hydroxybenzoic acid, and the like, thermal acid generators such as 2,4,4,6-tetrabromocyclohexadienone, benzoin tosylate, 2-nitrobenzyl tosylate, organosulfonic acid alkyl esters, and the like, and photo acid generators such as bis(p-tert-butylphenyl)iodonium trifluoromethanesulfonate, triphenylsulfonium trifluoromethanesulfonate, benzoin tosylate, 2-(4-methoxyphenyl)-4,6-bis(trichloromethyl)-1,3,5-triazine, N-hydroxysuccinimide trifluorimethanesulfonate, and the like. These acid and acid generator can be used alone or in the combination of two or more kinds. The content of the acid and/or acid generator in the anti-reflective coating composition of this invention is below 30% by weight, preferably 0.01–20% by weight based on the total weight of component (A) and (B).

An anti-reflective coating composition of this invention can further contain a resin which has a unit structure bearing at least one crosslinkable substituent in the unit. Examples of the crosslinkable substituent are hydroxy group, carboxyl group, amino group, and the like.

Examples of the resin which has a unit structure bearing at least one crosslinkable substituent in the unit are a resin derived from phenol compounds, a resin having hydroxystyrene unit structure, a resin which has a (meth)acrylic monomer unit bearing at least one hydroxy group in the unit such as 2-hydroxyethyl methacrylate, 2-hydroxypropyl methacrylate, 2-hydroxyethyl acrylate, 2-hydroxypropyl acrylate, and the like, a resin having (meth)acrylic acid unit structure, a resin having 2-hydroxyethyl vinyl ether unit structure, and the like.

Examples of those resins are, for example, novolac resin, brominated novolac resin, polyhydroxystyrene, co-polymer of hydroxystyrene and methyl methacrylate, co-polymer of hydroxystyrene and styrene, co-polymer of hydroxystyrene and 2-chloroethyl methacrylate, co-polymer of hydroxystyrene and 2,2,2-trichloroethyl methacrylate, co-polymer of hydroxystyrene and 2-fluoroethyl methacrylate, co-polymer of hydroxystyrene and 2,2,2-trifluoroethyl methacrylate, co-polymer of hydroxystyrene and glycidyl methacrylate, co-polymer of hydroxystyrene and 2-chloroethyl acrylate, co-polymer of hydroxystyrene and 2,2,2-trifluoroethyl acrylate, poly 2-hydroxyethyl methacrylate, co-polymer of 2-hydroxyethyl methacrylate and styrene, co-polymer of 2-hydroxyethyl methacrylate and hydroxystyrene, co-polymer of 2-hydroxyethyl methacrylate and methyl methacrylate, co-polymer of 2-hydroxyethyl methacrylate and glycidyl methacrylate, co-polymer of 2-hydroxyethyl methacrylate and 2,2,2-trifluoroethyl methacrylate, co-polymer of 2-hydroxyethyl methacrylate and 2-fluoroethyl methacrylate, co-polymer of 2-hydroxyethyl methacrylate and benzyl methacrylate, co-polymer of 2-hydroxyethyl methacrylate and isopropyl methacrylate, co-polymer of 2-hydroxyethyl methacrylate and 2,2,2-trichloroethyl methacrylate, co-polymer of 2-hydroxyethyl methacrylate and 2,2,2-tribromoethyl methacrylate, co-polymer of 2-hydroxyethyl methacrylate and 2-bromoethyl methacrylate, co-polymer of 2-hydroxyethyl methacrylate and 2-hydroxypropyl methacrylate, co-polymer of 2-hydroxyethyl methacrylate and maleimide, co-polymer of 2-hydroxyethyl methacrylate and maleic anhydride, co-polymer of 2-hydroxyethyl methacrylate and methyl vinyl ether, poly 2-hydroxypropyl methacrylate, co-polymer of 2-hydroxypropyl methacrylate and styrene, co-polymer of 2-hydroxypropyl methacrylate and methyl methacrylate, co-polymer of 2-hydroxypropyl methacrylate and 2,2,2-trifluoroethyl methacrylate, co-polymer of 2-hydroxypropyl methacrylate and 2-fluoroethyl methacrylate, co-polymer of 2-hydroxypropyl methacrylate and benzyl methacrylate, co-polymer of 2-hydroxypropyl methacrylate and isopropyl methacrylate, co-polymer of 2-hydroxypropyl methacrylate and 2,2,2-trichloroethyl methacrylate, co-polymer of 2-hydroxypropyl methacrylate and 2,2,2-tribromoethyl methacrylate, co-polymer of 2-hydroxypropyl methacrylate and 2-bromoethyl methacrylate, co-polymer of 2-hydroxypropyl methacrylate and maleimide, co-polymer of 2-hydroxypropyl methacrylate and maleic anhydride, co-polymer of 2-hydroxypropyl methacrylate and methyl vinyl ether, poly acrylic acid, co-polymer of acrylic acid and styrene, co-polymer of acrylic acid and hydroxystyrene, co-polymer of acrylic acid and methyl methacrylate, co-polymer of acrylic acid and glycidyl methacrylate, co-polymer of acrylic acid and 2,2,2-trifluoroethyl methacrylate, co-polymer of acrylic acid and 2-fluoroethyl methacrylate, co-polymer of acrylic acid and benzyl methacrylate, co-polymer of acrylic acid and isopropyl methacrylate, co-polymer of acrylic acid and 2,2,2-trichloroethyl methacrylate, co-polymer of acrylic acid and 2,2,2-tribromoethyl methacrylate, co-polymer of acrylic acid and 2-bromoethyl methacrylate, co-polymer of acrylic acid and maleimide, co-polymer of acrylic acid and maleic anhydride, co-polymer of acrylic acid and methyl vinyl ether, co-polymer of 2-hydroxyethyl vinyl ether and styrene, co-polymer of 2-hydroxyethyl vinyl ether and hydroxystyrene, co-polymer of 2-hydroxyethyl vinyl ether and methyl methacrylate, co-polymer of 2-hydroxyethyl vinyl ether and glycidyl methacrylate, co-polymer of 2-hydroxyethyl vinyl ether and 2,2,2-trifluoroethyl methacrylate, co-polymer of 2-hydroxyethyl vinyl ether and 2-fluoroethyl methacrylate, co-polymer of 2-hydroxyethyl vinyl ether and benzyl methacrylate, co-polymer of 2-hydroxyethyl vinyl ether and isopropyl methacrylate, co-polymer of 2-hydroxyethyl vinyl ether and 2,2,2-trichloroethyl methacrylate, co-polymer of 2-hydroxyethyl vinyl ether and 2-chlorolethyl methacrylate, co-polymer of 2-hydroxyethyl vinyl ether and 2,2,2-tribromoethyl methacrylate, co-polymer of 2-hydroxyethyl vinyl ether and 2-bromoethyl methacrylate, co-polymer of 2-hydroxyethyl vinyl ether and maleimide, co-polymer of 2-hydroxyethyl vinyl ether and maleic anhydride, co-polymer of 2-hydroxyethyl vinyl ether and methyl vinyl ether, and the like. These resins which have a unit structure bearing at least one crosslinkable substituent in the unit can be used alone or in the combination of two or more kinds. The content of the resin in the anti-reflective coating composition of this invention is below 50% by weight, preferably 0.5–30% by weight based on the total weight of component (A) and (B). A refractive index, an optical absorption factor, and an etching rate of the anti-reflective coating formed from an anti-reflective coating composition of this invention can be controlled by selecting a kind and an amount of the resins.

Further, rheology adjuster, co-adhesive agent, surfactant, and the like in addition to one described above can be, if necessary, added to the anti-reflective coating composition of this invention.

Rheology adjuster is added in order to mainly improve flow properties of the anti-reflective coating composition, and thus to improve filling properties of the anti-reflective coating composition into the hole's inner part, especially in the bake process. Concrete examples are phthalic acid compounds such as dimethyl phthalate, diethyl phthalate, diisobutyl phthalate, dihexyl phthalate, butylisodecyl phthalate, and the like, adipic acid compounds such as di(n-butyl) adipate, diisobutyl adipate, diisooctyl adipate, octyldecyl adipate, and the like, maleic acid compounds such as di(n-butyl) maleate, diethyl maleate, dinonyl maleate, and the like, oleic acid compounds such as methyl oleate, butyl oleate, tetrahydrofurfuryl oleate, and the like, or stearic acid compounds such as n-butyl stearate, glyceryl arearate, and the like. These rheology adjuster can be normally compounded less than 30% by weight based on the total weight of the composition.

Co-adhesive agent is added in order to mainly improve adherence of substrate or resist with the anti-reflective coating composition, and thus to prevent resist pattern collapse, especially in development. Concrete examples are chlorosilane compounds such as trimethyl chlorosilane, dimethylvinyl chlorosilane, methyldiphenyl chlorosilane, chloromethyl dimethyl chlorosilane, and the like, alkoxy silane compounds such as trimethyl methoxy silane, dimethyl diethoxy silane, methyl dimethoxy silane, dimethyl vinyl ethoxy silane, diphenyl dimethoxy silane, phenyl triethoxy silane, and the like, silazane compounds such as hexamethyl disilazane, N,N-bis(trimethylsilyl) urea, dimethyl trimethylsilylamine, trimethylsilylimidazole, and the like, silane compounds such as vinyl trichlorosilane, 3-chloropropyltrimethoxy silane, 3-aminopropyl triethoxysilane, 3-glycidoxypropyl trimethoxysilane, and the like, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, mercaptopyrimidine, and the like, and urea compounds such as 1,1-dimethylurea, 1,3-dimethylurea, and the like or thiourea compound. These co-adhesive compounds can be normally compounded less than 5% by weight, preferably less than 2% by weight based on the total weight of the composition.

Surfactant can be added to the anti-reflective coating composition to prevent occurrence of pin-hole, striation, and the like and further improve thickness uniformity of the various location on the substrate. Examples of surfactant are nonionic surfactant, for example, polyoxyethylene alkylether group such as polyoxyethylene laurylether, polyoxyethylene stearylether, polyoxyethylene cetylether, polyoxyethylene oleylether and the like, polyoxyethylene alkylaiiyl ether group such as polyoxyethylene octylphenolether, polyoxyethylene nonylphenolether and the like, polyoxyethylene-polyoxyethylene block copolymer group, sorbitan fatty acid ester group such as sorbitan monolaurate, sorbitan monopalmitate, sorbitan monostearate, sorbitan monooleate, sorbitan trioleate, sorbitan tristearate and the like, polyoxyethylene sorbitan fatty acid ester group such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan trisrearate and the like; fluorine family surfactant such as Eftop EF301, EF303, EF352 (produced by To Chem Products K.K.), Megafac F171, F173 (produced by Dai Nippon Ink and Chemicals, Inc.), Florad FC430, FC431 (produced by Sumitomo 3M K.K.), Asahiguard AG710, Surflon S-382, SC101, SC102, SC103, SC104, SC105, SC106 (produced by Asahi Glass Co., Ltd.) and the like; and organosiloxane polymer KP341 (produced by Shin-Etsu Chemical Co., Ltd.) among others. These surfactants can be normally compounded less than 0.2% by weight, preferably less than 0.1% by weight based on the total weight of the composition. These surfactants can be added alone or in the combination of two or more kinds.

An anti-reflective coating composition of this invention comprising component (A), (B), and other components described above is usually dissolved in an appropriate solvent. Examples of the solvents are ethyleneglycol monomethylether, ethyleneglycol monoethylether, methylcellosolve acetate, ethylcellosolve acetate, diethyleneglycol monomethylether, diethyleneglycol monoethylether, propyleneglycol, propyleneglycol monomethylether, propyleneglycol monomethylether acetate, propyleneglycol propylether acetate, toluene, xylene, methylethylketone, cyclopentanone, cyclohexanone, 2-hydroxypropionic acid ethyl ester, 2-hydroxy-2-methylpropionic acid ethyl ester, ethoxyacetic acid ethyl ester, hydroxyacetic acid ethyl ester, 2-hydroxy-3-butanoic acid methyl ester, 3-methoxypropionic acid methyl ester, 3-methoxypropionic acid ethyl ester, 3-ethoxypropionic acid methyl ester, 3-ethoxypropionic acid ethyl ester, pyruvic acid ethyl ester, pyruvic acid methyl ester, acetic acid ethyl ester, acetic acid butyl ester, lactic acid ethyl ester, lactic acid butyl ester, and the like. These organic solvents can be used alone or in the combination of two or more than two kinds.

In addition, high boiling point solvents such as propyleneglycol monobutylether, propyleneglycol monobutylether acetate and the like can be combined for the use. Propyleneglycol mono methyl ether, propyleneglycol monomethylether acetate, lactic acid ethyl ester, lactic acid butyl ester and cyclohexanone amoung these solvents are prefered in terms of improving leveling properties.

Either the negative type or the positive type photoresist can be used as photoresist coated over the top layer of the anti-reflective coating of the present invention, and example as such are a positive type photoresist comprising a novolac resin and 1,2-naphthoquinone diazidesulfonic acid ester, a chemical amplification type photoresist comprising a photo-acid generator and a binder having group which can increase alkaline dissolving speed by the decomposition with an acid, a chemical amplification type photoresist comprising a photo-acid generator, an alkaline soluble binder, and a low molecular weight compound which can increase alkaline dissolving speed of the photoresist by the decomposition with an acid, a chemical amplification type photoresist comprising a photo-acid generator, a binder having group which can increase alkaline dissolving speed by the decomposition with an acid, and a low molecular weight compound which can increase alkaline dissolving speed of the photoresist by the decomposition with an acid, and the like, and for example a product with Trade Name APEX-E by Shipley Company can be mentioned.

As the developer for the positive type photoresist coated over the anti-reflective coating for lithography formed with the use of the anti-reflective coating composition of this invention, an alkaline solution made of, for example, inorganic alkaline group such as sodium hydroxide, potassium hydroxide, sodium carbonate, sodium silicate, sodium metasilicate, aqueous ammonia and the like, primary amine group such as ethyl amine, n-propyl amine and the like, secondary amine group such as diethyl amine, di(n-butyl) amine and the like, tertiary amine group such as triethyl amine, methyldiethyl amine and the like, alcohol amine group such as dimethyl ethanol amine, triethanol amine and the like, quaternary ammonium salt group such as tetramethyl ammonium hydroxide, tetraethyl ammonium hydroxide, choline and the like, and cyclic amine group such as pyrrole, piperidine and the like, can be used. Furthermore, a proper amount of alcohol group such as isopropyl alcohol and the like and surfactant such as nonionic type and the Next, the method of forming photoresist pattern of the present invention explained below. The anti-reflective coating is prepared by coating the anti-reflective coating composition with the coating method such as spinner, coater and the like over substrate (for example, clear substrate such as silicon/silicon dioxide covering, glass substrate, ITO substrate and the like) used for the preparation of precision integrated circuit elements, and then hardened by baking. Here, 0.01–3.0 µm is preferred as the film thickness of the anti-reflective coating. In addition, the condition for baking after coating is at 80–250 for 1–120 minutes. Then, good photoresist pattern can be obtained by applying photoresist, exposing through the predetermined mask, developing, rinsing and drying. PEB (post exposure bake) can be done if necessary. Then, the desired pattern can be formed on the substrate after dry etching removal of the part of the anti-reflective coating whose overcoated photoresist was removed in advance by developing.

An anti-reflective coating made from the anti-reflective coating composition of the present invention can be used at a thinner thickness, and therefore the anti-reflective coating can be removed by dry etching in shorter time than ever before. The anti-reflective coating also has a greater dry etching rate compared with that of photoresist.

An anti-reflective coating made from the anti-reflective coating composition of this invention can prevent a reflective light of the exposure light from the substrate, and can also function as a layer which prevents interaction between the substrate and the photoresist and protect the substrate from adverse effects of phtoresist materials or materials generated during the photoresist exposure although it depends on the process conditions.

EXAMPLES

The present invention is described in greater detail below by referring to the Examples, however, the present invention should not be construed as being limited thereto.

Synthetic Example 1

10.0 g of hexamethoxymethylmelamine compound (product name Cymel303, available from Mitui Cyanamid Co., Ltd.) and 10.0 g of methoxymethylated ethoxymethylated benzoguanamine compound (product name Cymel1123, available from Mitui Cyanamid Co., Ltd.) were dissolved in 100 g of lactic acid ethyl ester and 0.5 g of p-toluenesulfonic acid was added to the solution. The reaction mixture was reacted at 120 for 24 hours to give a solution containing a resin of Cymel 303 and Cymel1123. The resin obtained was subjected to GPC analysis and found to have a weight average molecular weight (Mw), in terms of standard polystyrene, of 12000.

Synthetic Example 2

20.0 g of methoxymethylated ethoxymethylated benzoguanamine compound (Cymel1123) was dissolved in 100 g of lactic acid ethyl ester and 0.5 g of p-toluenesulfonic acid was added to the solution. The reaction mixture was reacted at 105 for 24 hours to give a solution containing a resin of Cymel1123. The resin obtained was subjected to GPC analysis and found to have a weight average molecular weight (Mw), in terms of standard polystyrene, of 7000.

Synthetic Example 3

70 g of epoxy-novolac resin (Trade Name DEN438, Mw:700, available from Dow Chemical, Japan) was dissolved in 615 g of propyleneglycol monomethylether acetate and then 82 g of 9-anthracene carboxylic acid and 2.2 g of benzyltriethylammonium chloride were added to the solution. The reaction mixture was reacted at 130 for 24 hours to give a solution containing the resin shown in Formula III.

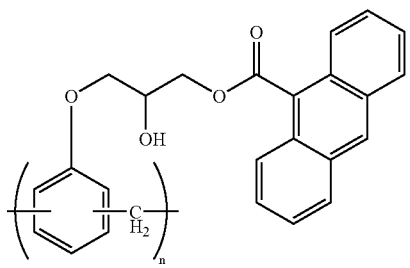

Formula III

Synthetic Example 4

30 g of trifluoroethyl methacrylate, 12.3 g of methacrylic acid, and 4.6 g of 2-hydroxyethyl methacrylate were dissolved in 201 g of propyleneglycol monomethylether. The solution was heated to 60 and 3.3 g of 2,2'-azobis(4-methoxy-2,4-dimethylvaleronitrile) was added to the solution at that temperature. The reaction mixture was reacted at 60 for 24 hours. After cooling the reaction solution, the solution was poured into water-ethyl alcohol mixed solution. The resin product (Formula IV) precipitated was collected and dried at 100 under vacuum. The resin obtained was subjected to GPC analysis and found to have a weight average molecular weight (Mw), in terms of standard polystyrene, of 15000.

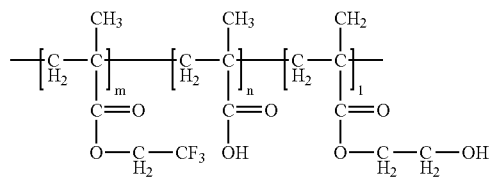

Formula IV

Synthetic Example 5

30 g of trichloroethyl methacrylate and 4.5 g of 2-hydroxyethyl methacrylate were dissolved in 145 g of propyleneglycol monomethylether. The solution was heated to 60 and 1.7 g of 2,2'-azobis(4-methoxy-2,4-dimethylvaleronitrile) was added to the solution at that temperature. The reaction mixture was reacted at 60 for 24 hours. After cooling the reaction solution, the solution was poured into water-ethyl alcohol mixed solution. The resin product (Formula V) precipitated was collected and dried at 100 under vacuum. The resin obtained was subjected to GPC analysis and found to have a weight average molecular weight (Mw), in terms of standard polystyrene, of 11000.

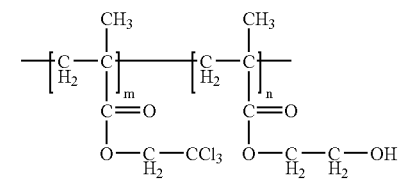

Formula V

Synthetic Example 6

21 g of glycidyl methacrylate and 39 g of 2-hydroxxypropyl methacrylate were dissolved in 242 g of propyleneglycol monomethyl ether. The solution was heated to 70 and 0.6 g of azobisisobutylonitrile was added to the solution at that temperature. The reaction mixture was reacted at 70 for 24 hours to give a solution containing copolymer of glycidyl methacrylate 2-hydroxxypropyl methacrylate. 10 g of 9-anthracene carboxylic acid and 0.3 g of benzyltrimethylaammonium chloride were added to 100 g of the solution and the mixture was reacted at 130 for 24 hours to give a solution containing resin of Formula VI.

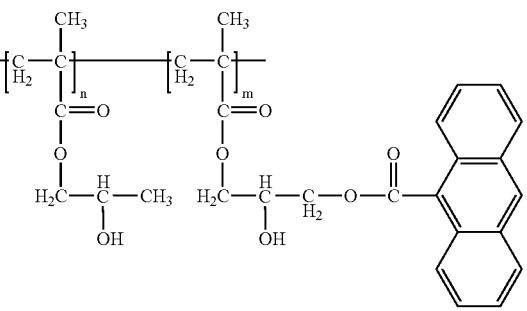

Formula VI

Example 1

To a mixture of 50 g of the solution containing 8.5 g of the resin obtained in synthetic example 1, 17 g of the solution containing 3.4 g of the resin obtained in synthetic example 3, 1.2 g of the resin of Formula obtained in synthetic example 5, and 0.5 g of pyridinium p-toluenesulfonate, 122 g of lactic acid ethyl ester and 150 g of propyleneglycol monomethylether acetate were added to give a solution. The solution was filtered through a micro-filter made by polyethylene with a pore size of 0.10 µm and then filtered through a micro-filter made by polyethylene with a pore size of 0.05 µm to prepare an anti-reflective coating composition solution.

Example 2

An anti-reflective coating composition solution was prepared from 50 g of the solution containing 8.5 g of the resin obtained in synthetic example 1, 16.3 g of the solution containing 3.3 g of the resin obtained in synthetic example 3, 0.83 g of the rein of Formula obtained in synthetic example 7, 0.5 g of pyridinium p-toluenesulfonate, 115 g of lactic acid ethyl ester, and 144 g of propyleneglycol monomethylether acetate according to the same procedure in example 1.

Example 3

An anti-reflective coating composition solution was prepared from 50 g of the solution containing 8.5 g of the resin obtained in synthetic example 1, 1.2 g of the rein of Formula obtained in synthetic example 5, 1.8 g of 9-hydroxymethylanthracene, 0.5 g of pyridinium p-toluenesulfonate, 103 g of lactic acid ethyl ester, and 144 g of propyleneglycol monomethylether acetate according to the same procedure in example 1.

Example 4

An anti-reflective coating composition solution was prepared from 50 g of the solution containing 8.5 g of the resin obtained in synthetic example 1, 0.83 g of the rein of Formula obtained in synthetic example 7, 1.7 g of 9-hydroxymethylanthracene, 0.5 g of pyridinium p-toluenesulfonate, 97 g of lactic acid ethyl ester, and 138 g of propyleneglycol monomethylether acetate according to the same procedure in example 1.

Example 5

An anti-reflective coating composition solution was prepared from 50 g of the solution containing 8.5 g of the resin obtained in synthetic example 1, 1.2 g of the rein of Formula obtained in synthetic example 5, 2.6 g of 3-hydroxy-7-methyl-2-naphtoic acid, 0.5 g of pyridinium p-toluenesulfonate, 112 g of lactic acid ethyl ester, and 153 g of propyleneglycol monomethylether acetate according to the same procedure in example 1.

Example 6

An anti-reflective coating composition solution was prepared from 50 g of the solution containing 8.5 g of the resin obtained in synthetic example 1, 0.83 g of the rein of Formula obtained in synthetic example 7, 2.4 g of 3-hydroxy-7-methyl-2-naphtoic acid, 0.5 g of pyridinium p-toluenesulfonate, 105 g of lactic acid ethyl ester, and 147 g of propyleneglycol monomethylether acetate according to the same procedure in example 1.

Example 7

An anti-reflective coating composition solution was prepared from 50 g of the solution containing 8.5 g of the resin obtained in synthetic example 1, 1.2 g of the rein of Formula obtained in synthetic example 5, 1.8 g of 3,7-dihydroxy-2-naphtoic acid, 0.5 g of pyridinium p-toluenesulfonate, 103 g of lactic acid ethyl ester, and 144 g of propyleneglycol monomethylether acetate according to the same procedure in example 1.

Example 8

An anti-reflective coating composition solution was prepared from 50 g of the solution containing 8.5 g of the resin obtained in synthetic example 1, 0.83 g of the rein of Formula obtained in synthetic example 7, 1.7 g of 3,7-dihydroxy-2-naphtoic acid, 0.5 g of pyridinium p-toluenesulfonate, 97 g of lactic acid ethyl ester, and 138 g of propyleneglycol monomethylether acetate according to the same procedure in example 1.

Example 9

An anti-reflective coating composition solution was prepared from 50 g of the solution containing 8.5 g of the resin obtained in synthetic example 2, 5.4 g of the solution containing 1.1 g of the resin obtained in synthetic example 3, 1.2 g of the rein of Formula obtained in synthetic example 5, 0.5 g of pyridinium p-toluenesulfonate, 95 g of lactic acid ethyl ester, and 131 g of propyleneglycol monomethylether acetate according to the same procedure in example 1.

Example 10

An anti-reflective coating composition solution was prepared from 50 g of the solution containing 8.5 g of the resin obtained in synthetic example 2, 5.4 g of the solution containing 1.1 g of the resin obtained in synthetic example 3, 0.83 g of the rein of Formula obtained in synthetic example 7, 0.5 g of pyridinium p-toluenesulfonate, 89 g of lactic acid ethyl ester, and 126 g of propyleneglycol monomethylether acetate according to the same procedure in example 1.

Comparative Example 1

An anti-reflective coating composition solution was prepared from 10 g of the solution containing 2 g of the resin obtained in synthetic example 9, 0.3 g of hexamethoxymethylmelamine, 0.01 g of p-toluenesulfonic acid, 37.3 g of propyleneglycol monomethylether, and 19.4 g of propyleneglycol monomethylether acetate according to the same procedure in example 1.

Optical Parameters Measurements and First Minimum Film Thickness Simulation

The composition solutions obtained in examples 1–10 and comparative example 1 described above were applied over silicon wafers with a spinner. The wafers were heated on the hot plate for one minute at 225 to form anti-reflective coatings (film thickness: 0.04 µm). Refractive indexes (n value) and optical absorption factors (k value) of the anti-reflective coatings were measured at 248 nm with a spectroscopic ellipsometer. The results were shown in Table 1.

The first minimum film thickness and reflectivity at the first minimum film thickness of the antireflective coatings were calculated based on the refractive indexes (n value) and optical absorption factors (k value) obtained above using a simulation program, PROLITH/2 available from FINLE Technologies, Inc. The results were shown in Table 1.

Dissolution Test

The compositions obtained in example 1–10 were applied over silicon wafers with a spinner. The wafers were heated on the hot plate for one minute at 225 to form anti-reflective coatings (film thickness:0.10 µm). Those anti-reflective coatings were dipped in solvents used for the photoresist such as lactic acid ethyl ester and propyleneglycol methyl ester, and the fact that the coatings were insoluble in these solvents was confirmed.

The composition obtained in comparative example 1 was applied over silicon wafer with a spinner. The wafer was heated on the hot plate for one minute at 205 to form anti-reflective coatings (film thickness:0.10 µm). The anti-reflective coating was dipped in solvents used for the photoresist such as lactic acid ethyl ester and propyleneglycol methyl ester, and the fact that the coating was insoluble in these solvents was confirmed.

Intermixing Test

The compositions obtained in example 1–10 and comparative example 1 were applied over silicon wafers with a spinner. The wafers were heated on the hot plate for one minute at 205 to form anti-reflective coatings (film thickness:0.10 µm). Photoresist solution, product name UV113 available from Shipley Company, was applied with a spinner on the top of the anti-reflective coatings. Those heated on a hot plate for one minute at 120, photoresist was exposed, and then post exposure bake was done for one minute at 115 . The film thickness of the antireflective coatings was measured after photoresist development. The fact that intermixing do not occur between the anti-reflective coatings and the photoresist was confirmed.

Dry Etching Rate Measurement

Anti-reflective coatings were formed from compositions obtained in example 1–10 and comparative example 1 according to the same method described in Dissolution Test on silicon wafers. Dry etching rate of those coatings were measured under the condition of CF4 dry etching gas by means of RIE system ES401 manufactured by Japan Scientific. Dry etching rate of photoresist (UV113 available from Shipley Company) was measured in the same conditions.

The dry etching rate selectivity is shown in Table 1 for the dry etching rate of the anti-reflective coatings when the dry etching rate of the photoresist is set at 1.00.

Photoresist Pattern Forming Test

The composition obtained in example 1 was applied over silicon wafers with a spinner and the wafer was heated on the hot plate for one minute at 225 to form anti-reflective coating (film thickness:0.042 µm). Photoresist solution, product name SERP430 available from Shin-Etsu Chemical Co., Ltd., was applied with a spinner on the top of the anti-reflective coating and the wafer was heated on a hot plate for 90 seconds at 100 to form photoresist layer (film thickness:0.55 µm).

The photoresist was exposed to light at wavelength of 248 nm using PAS5500/300 scanner manufactured by ASML Company (NA:0.63, σ:0.87/0.57 Annular) through a photomask which was designed to make nine lines photoresist pattern having 0.175 µm line width and 0.175 µm width between lines (0.175 µm L/S) on the wafer.

After post exposure bake on a hot plate for 90 seconds at 110, cooling, photoresist development for 60 seconds using OPD262 developer available from Arch Chemical, rinsing with water, and drying, the obtained photoresist pattern was observed with a scanning electron microscope. The SEM examination shows that the obtained photoresist pattern has an excellent straight pattern shape.

Photoresist patterns were formed using the anti-reflective coatings obtained from the compositions of examples 2, 3, 4, 9 and 10, film thickness of the coatings 0.040 µm(ex.2), 0.039 µm(ex.3), 0.038 µm(ex.4), 0.045 µm(ex.9), 0.041 µm(ex.10), according to the same method for example 1. The SEM examination shows that the obtained photoresist patterns have an excellent straight pattern shapes.

TABLE

| example | refractive index (n) | optical absorption factor (k) | first minimum (nm) | reflectivity (%) | etching rate selectivity |
|---|---|---|---|---|---|
| 1 | 1.78 | 0.51 | 42 | 0.04 | 1.3 |
| 2 | 1.82 | 0.53 | 40 | 0.03 | 1.3 |
| 3 | 1.84 | 0.53 | 39 | 0.04 | 1.4 |
| 4 | 1.86 | 0.56 | 38 | <0.01 | 1.4 |
| 5 | 1.91 | 0.58 | 35 | <0.01 | 1.5 |
| 6 | 1.97 | 0.60 | 33 | <0.01 | 1.5 |
| 7 | 1.88 | 0.56 | 37 | <0.01 | 1.6 |
| 8 | 1.93 | 0.58 | 35 | <0.01 | 1.6 |
| 9 | 1.74 | 0.53 | 45 | <0.01 | 1.3 |
| 10 | 1.79 | 0.55 | 41 | <0.01 | 1.3 |
| comp. 1 | 1.50 | 0.48 | 57 | 0.19 | 1.3 |

These results mentioned above show that the anti-reflective coatings obtained from the compositions (Example 1–10) can be used at thinner film thickness and with that the time to remove the anti-reflective coatings by dry etching can be shortened more than before, and the coatings have large dry etching rate selectivity and can effectively prevent the reflection light from the substrate in comparison to the known anti-reflective coating of comparative example 1.

The present invention provides a composition for an anti-reflective coating which is used at thinner thickness enough to shorten dry etching time for the anti-reflective coating removal, has a greater dry etching rate in comparison to a photoresist layer, and shows high light absorption effect of the light used for the lithography process in the preparation of semiconductor device.

The present invention provides a composition for an anti-reflective coating showing no intermixing with photoresist layer, high resolving power, and excellent photoresist film thickness dependence, and the present invention offer the excellent photoresist pattern forming method.

We claim:

1. An anti-reflective coating composition comprising
   (A) a resin made from a triazine compound having at least two nitrogen atoms substituted by a hydroxymethyl group and/or an alkoxymethyl group, said resin having a weight average molecular weight of at least 5000; and
   (B) a light absorbing compound and/or a light absorbing resin,
   components (A) and (B) being dissolved in a solvent.

2. An anti-reflective coating composition according to claim 1, wherein said triazine compound is selected from the group consisting of melamine compounds and benzoguanamine compounds.

3. An anti-reflective coating composition according to claim 1, wherein said resin is made from melamine compounds having at least two nitrogen atoms substituted by a hydroxymethyl group and/or an alkoxymethyl group and benzoguanamine compounds having at least two nitrogen atoms substituted by a hydroxymethyl group and/or an alkoxymethyl group, and has a weight average molecular weight of 5000–50000.

4. An anti-reflective coating composition according to claim 1, wherein said resin is made from hexamethoxymethylmelamine and tetramethoxymethyl benzoguanamine, and has a weight average molecular weight of 7000–30000.

5. An anti-reflective coating composition according to any one of claims 1 to 4, wherein said light absorbing compound is at least one compound selected from the group consisting of naphthalene compounds and anthracene compounds.

6. An anti-reflective coating composition according to any one of claims 1 to 4, wherein said a light absorbing compound is 9-hydroxymethylanthracene.

7. An anti-reflective coating composition according to any one of claims 1 to 6, said light absorbing resin has at least one ring structure selected from the group consisting of benzene ring structure, naphthalene ring structure and anthracene ring structure.

8. An anti-reflective coating composition according to any one of claims 1 to 7, which further contains an acid and/or acid generator.

9. An anti-reflective coating composition according to claim 8, said acid is at least one acid selected from the group consisting of aliphatic carboxylic acids, aliphatic sulphonic acids, aromatic carboxylic acids, and aromatic sulphonic acids.

10. An anti-reflective coating composition according to any one of claims 1 to 9, which further contains a resin which has a unit structure bearing at least one crosslinkable substituent in the unit.

11. An anti-reflective coating composition according to any one of claims 1 to 10, wherein the amount of the component (A) is in the range from 50 to 99% by weight based on the total amount of the components (A) and (B).

12. A method for forming an anti-reflective coating for use in lithography process for manufacturing a semiconductor device, wherein said coating is obtained by applying an anti-reflective coating composition according to any one of claims 1 to 11 onto a substrate and baking.

13. A method for manufacturing a semiconductor device, comprising applying an anti-reflective coating composition according to any one of claims 1 to 11 onto a substrate and baking it to form an anti-reflective coating, covering said coating with a photoresist, exposing the substrate covered with said anti-reflective coating and said photoresist, developing and transferring an image onto the substrate by etching to form integrated circuit elements.

14. An anti-reflective coating composition comprising:
(A) a resin comprising a plurality of triazine moieties having at least two nitrogen atoms substituted by a hydroxymethyl group and/or an alkoxymethyl group, said triazine moieties joined together via a —$CH_2$— linkage group and/or a —$CH_2$—O—$CH_2$— linkage group, said resin having a weight average molecular weight of at least 5000; and
(B) a light absorbing compound and/or a light absorbing resin.

15. An anti-reflective coating composition according to claim 14, wherein said components (A) and (B) are dissolved in a solvent.

16. An anti-reflective coating composition according to claim 14, wherein said triazine moieties are selected from the group consisting of melamine compounds and benzoguanamine compounds.

17. An Anti-reflective coating composition according to claim 14, wherein said resin is made from melamine compounds having at least two nitrogen atoms substituted by a hydroxymethyl group and/or an alkoxymethyl group and benzoguanamine compounds having at least two nitrogen atoms substituted by a hydroxymethyl group and/or an alkoxymethyl group, and has a weight average molecular weight of 5000–50000.

18. An Anti-reflective coating composition according to claim 14, wherein said resin is made from hexamethoxymethylmelamine and tetramethoxymethyl benzoguanamine, and has a weight average molecular weight of 7000–30000.

* * * * *

UNITED STATES PATENT AND TRADEMARK OFFICE
CERTIFICATE OF CORRECTION

PATENT NO. : 7,038,328 B2
APPLICATION NO. : 10/271646
DATED : May 2, 2006
INVENTOR(S) : Tomoyuki Enomoto, Keisuke Nakayama and Rama Puligadda It is certified that error appears in the above-identified patent and that said Letters Patent is hereby corrected as shown below:

Column 14, lines 47 and 67, and column 15, lines 21, 41, and 64, the reference to synthetic example "7", each occurrance, should read --4--.

Column 16, line 5, the reference to synthetic example "9" should read --6--.

Signed and Sealed this

First Day of December, 2009

David J. Kappos
*Director of the United States Patent and Trademark Office*